(12) United States Patent
Kesälä

(10) Patent No.: US 6,699,524 B2
(45) Date of Patent: Mar. 2, 2004

(54) METHOD AND APPARATUS FOR FEEDING GAS PHASE REACTANT INTO A REACTION CHAMBER

(75) Inventor: Janne Kesälä, Espoo (FI)

(73) Assignee: ASM Microchemistry OY, Espoo (FI)

( * ) Notice: Subject to any disclaimer, the term of this patent is extended or adjusted under 35 U.S.C. 154(b) by 122 days.

(21) Appl. No.: 09/854,706

(22) Filed: May 14, 2001

(65) Prior Publication Data

US 2001/0042523 A1 Nov. 22, 2001

(30) Foreign Application Priority Data

May 15, 2000 (FI) .............................................. 20001166

(51) Int. Cl.⁷ ............................................ C23C 16/448
(52) U.S. Cl. ................................ 427/248.1; 427/255.28
(58) Field of Search .......................... 427/248.1, 255.28; 418/715, 726

(56) References Cited

U.S. PATENT DOCUMENTS

| | | |
|---|---|---|
| 4,058,430 A | 11/1977 | Suntola et al. |
| 4,389,973 A * | 6/1983 | Suntola et al. .............. 118/725 |
| 5,855,680 A | 1/1999 | Soininen et al. |

FOREIGN PATENT DOCUMENTS

| WO | WO 01/36702 A1 | 5/2001 |
|---|---|---|

OTHER PUBLICATIONS

Pierson, Handbook of Chemical Vapor Deposition, (1992), pp. 87–88.*

Niinisto et al., "ALD precursor chemistry: evolution and future challenges," Journal de Physsique IV. vol. 9 (1999), pp. Pr8–837–Pr8–852.

M. Leskela et al., "Synthesis of oxide thin films and overlayers by atomic layer epitaxy for advanced applications," Materials Science & Engineering, vol. B41 (1996), pp. 23–29.

Tuomo Suntola, "Atomic layer epitaxy," Thin Solid Films, vol. 216 (1992), pp. 84–89.

* cited by examiner

Primary Examiner—Timothy Meeks
(74) Attorney, Agent, or Firm—Knobbe, Martens, Olson & Bear, LLP.

(57) ABSTRACT

The present invention concerns a method and an apparatus for feeding a gas phase reactant from a reactant source into a gas phase reaction chamber. In the method a reactant which is a liquid or solid at ambient temperature is vaporized from the reactant source at a vaporizing temperature; and the vaporized reactant is fed into the reaction chamber. According to the invention the reactant source and the reaction chamber are located in separate vessels which can be individually evacuated. By means of the invention it becomes possible to change and load new reactant chemical without breaking the vacuum of the reaction chamber.

34 Claims, 4 Drawing Sheets

METHOD AND APPARATUS FOR FEEDING GAS PHASE REACTANT INTO A REACTION CHAMBER

Priority Information

This invention is based on and claims priority to Finnish Application No. 20001166, filed May 15, 2000.

BACKGROUND OF THE INVENTION

1. Field of the Invention

The present invention relates to the use of liquids and in particular solid substances as precursors of gas phase processing of, e.g., thin films. Particularly, the invention concerns a method and an apparatus in which liquid or solid matter is vaporised in a reactant source and the vaporised reactant is fed into the reaction chamber of a gas phase process for example for growing a thin film on the substrate of a semiconductor device.

2. Description of Related Art

During processing of semiconductor wafers various gases are fed into the reaction chamber. Typically the gases employed are present in gaseous form in the reactant source. They are also often gaseous at ambient (i.e. normal) pressure and temperature. Examples include nitrogen, oxygen, hydrogen, and ammonia. In some cases, gases of source chemicals which are liquid or solid at ambient pressure and temperature are used. These substances may have to be heated to produce sufficient amounts of gases for the reaction. For some solid substances, the vapour pressure at room temperature is so low that they have to be heated even up to several hundred degrees centigrade.

Generally the solid precursor is present in the form of a powder possibly may abundantly fines, which make the solid matter into a dusting powder. The dust can easily be conducted along with the reactant and the small particles and fines can be conveyed by diffusion. If the particles end up on the substrate they may cause small pin point sized holes and deformations in the thin film which can affect the operation of the film.

Conventionally, the solid precursor material has been placed in open containers which communicate with the reaction chamber. No means for separating dust from vaporised reactant gases has been provided. The containers are usually fitted inside the same pressure shell as the reaction chamber. As a result, the size of the pressure shell or vacuum vessel has to be increased. Further, the chemical is contacted with air during loading and maintenance operations which may lead to contamination of the precursor material. During loading of the chemical, the vacuum of the reactor chamber is broken. When the reactant source is located inside the reactor, there will also be constant evaporation of the chemical and at least some of the vaporised precursor will be drained via an outlet channel and some material will be deposited on the channel walls.

SUMMARY OF THE INVENTION

It is an aim of the present invention to eliminate the drawbacks of prior solutions and to provide an entirely novel method and apparatus for feeding gas phase pulses from liquid or, in particular, solid sources into a gas phase reactor.

It is a further aim of the invention to provide a novel reactant source assembly for generating a gas phase reactant flow.

These and other objects, together with the advantages thereof over known processes and apparatuses which shall become apparent from the following specification, are accomplished by the invention as hereinafter described and claimed.

The present invention is based on the idea separating the production of reactant gas from the use of the gas in a gas phase process. Basically this concept is implemented by providing two separate units, viz. a reactant source and a reaction chamber which are located in separate vessels each inside a pressure shell of its own. Thereby the units can be separately and individually evacuated to allow for independent operation and maintenance of both.

It is preferred to provide the reactant source with a gas inlet for feeding gas into the reactant source and a gas outlet for withdrawal of gaseous reactant. Thereby, carrier gas can be fed into the reactant source and the necessary flow of gas from the reactant source to the reactor can be achieved by means of the carrier gas which contains evaporated reactant.

According to a particularly preferred embodiment, the reactant source comprises a first container having an opening and which is placed within a pressure shell and heated to the vaporising temperature by using heating means fitted within the pressure shell. The vaporised reactant is conducted from the container through a first purifier to remove impurities contained in the vaporised reactant; the vaporised reactant is collected in a gas space: and the gas phase reactant is fed from the gas space into the gas phase reaction chamber via a first conduit interconnecting the reactant source and the reactor.

Based on the above, the invention provides a novel reactant source assembly for generating a gas phase reactant flow. It comprises a first container having an opening and containing liquid or solid reactant matter; a second container having a gas tight container wall enclosing the first container and defining a gas space around the first container; at least one first gas nozzle fitted in the container wall of the second container for feeding gas into the gas space; and at least one second gas nozzle fitted in the container wall of the second container for withdrawing reactant vaporized from first container and collected in the gas space.

More specifically, the method according to the invention is mainly characterized by what is stated in the characterizing part of claim 1.

Considerable advantages are obtained by the present invention. The invention makes it possible to change and load new reactant chemical without breaking the vacuum of the reaction chamber. Contact between the reactant chemical and air can be prevented. No separate heating of the conduit interlinking the reactant source and the reaction chamber is needed. A constant flow of reactant gas can be ensured. Dust can efficiently be removed from the reactant gas. The modular concept of the invention can be broadened so as to allow for a plurality of reactant sources connected to the same reactor.

The invention can be applied to a large number of solid precursors, such as metal compounds, such as metal halides, organometal compounds comprising metal-to-carbon bonds, metalorganic compounds, which do not comprise a metal-to-carbon bond but which contain carbon (e. g. thd compounds), and elemental metals.

Next the invention will be examined more closely with the aid of a detailed description and with reference to a working embodiment.

DETAILED DESCRIPTION OF THE INVENTION

Figure 1:
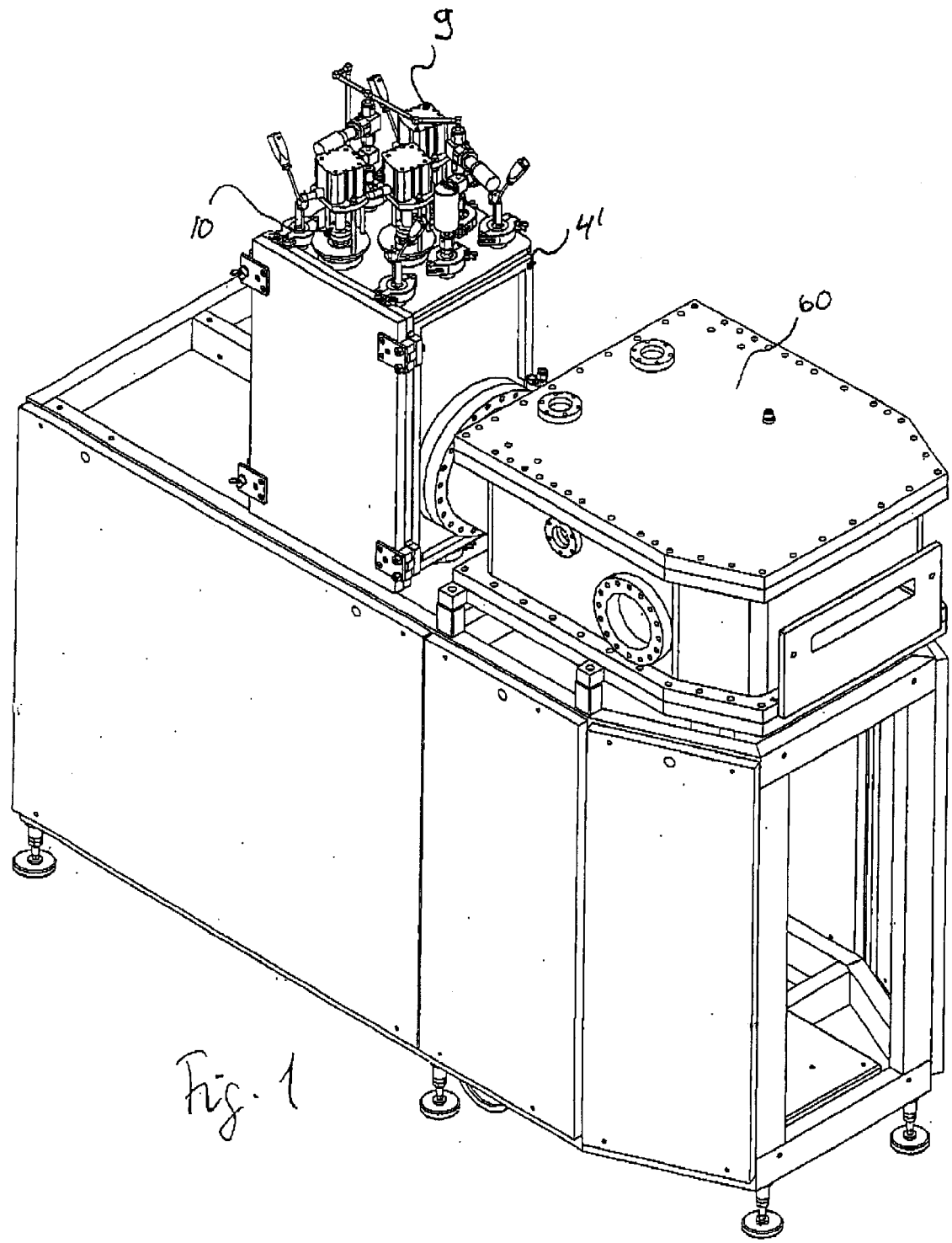
FIG. 1 shows in a perspective view a reactant source assembly combined with a reactor chamber.
Figure 2:
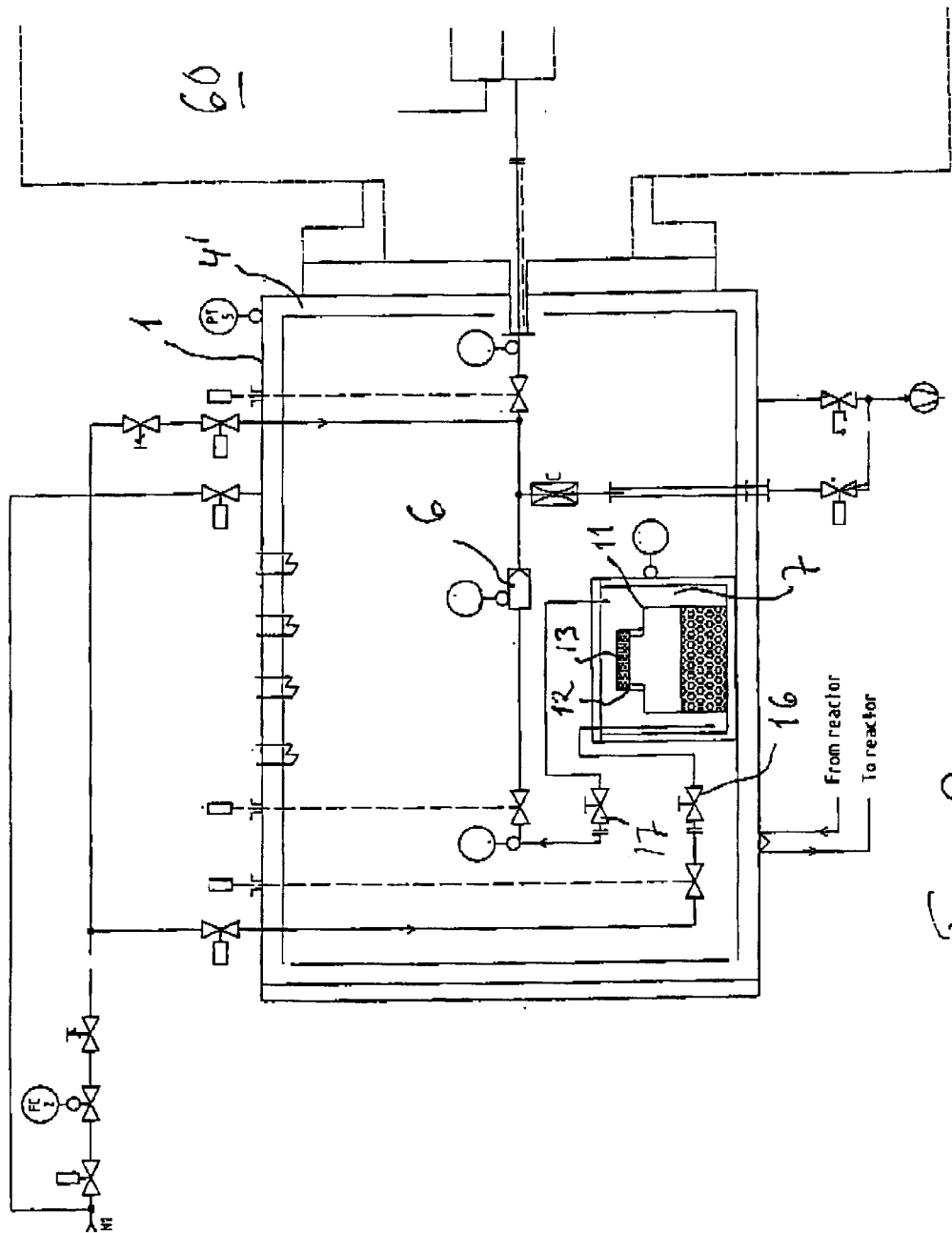
FIG. 2 shows in a sectional side view the principal construction of a reactant source according to the invention.
Figure 3:
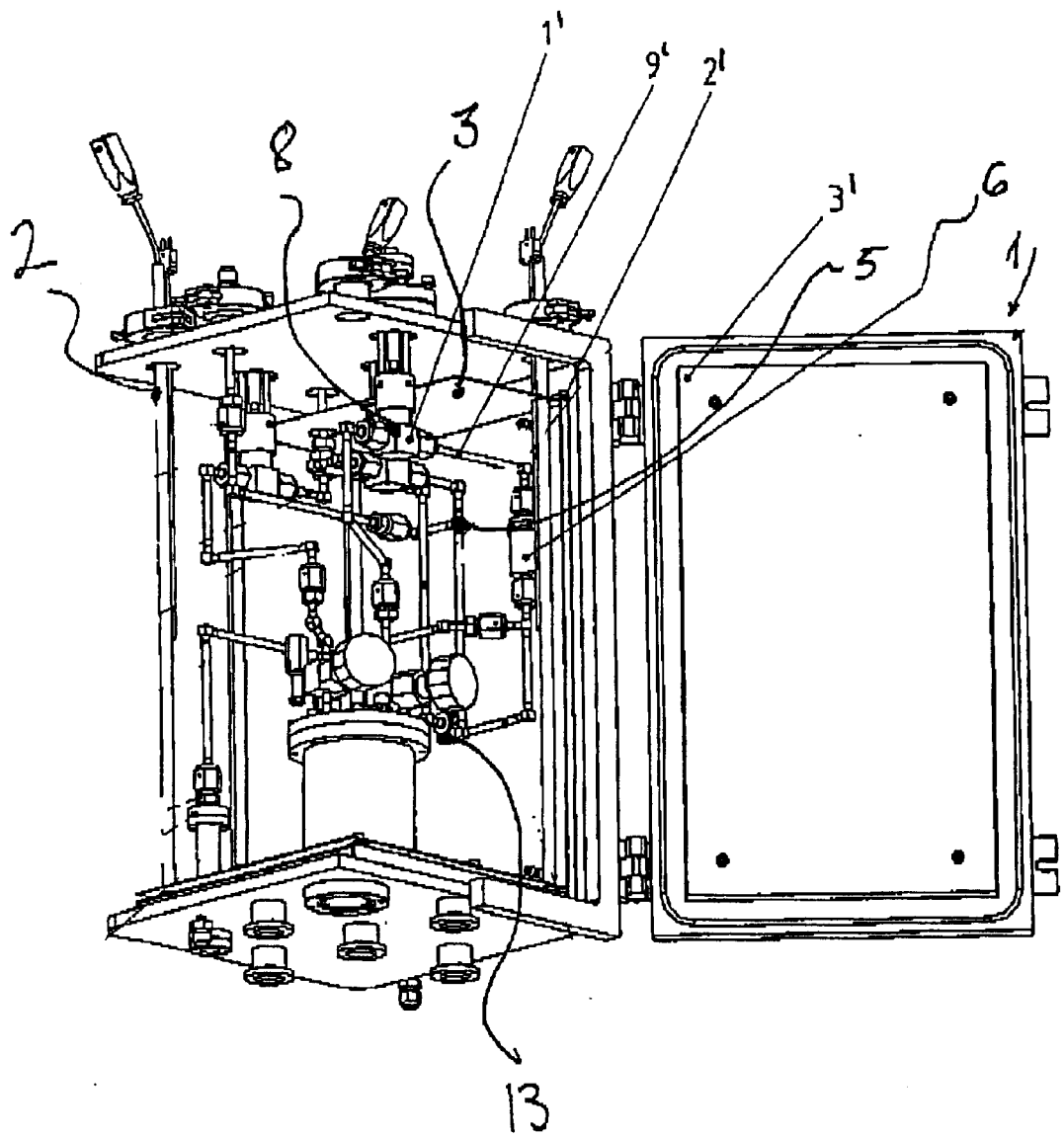
FIG. 3 shows in a perspective view the construction of the reactant source.
Figure 4:
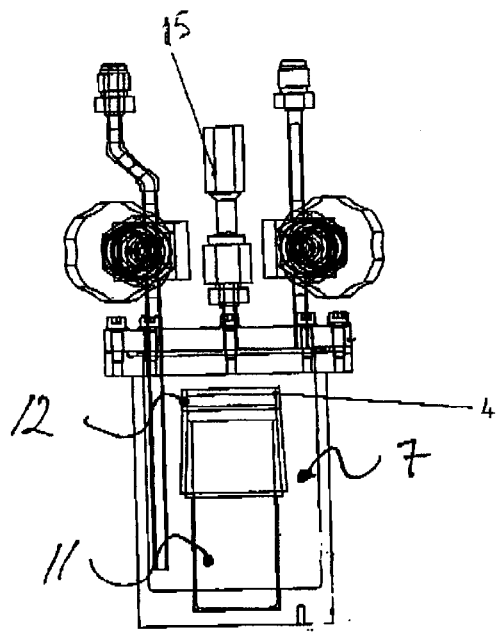
FIG. 4 shows in a sectional side view the construction of a solid source assembly.

As discussed above, tie invention concerns a method and an apparatus for feeding a gas phase reactant from a reactant source into a gas phase reaction chamber. In the method a reactant which is a liquid or solid at ambient temperature is vaporised from the reactant source at a vaporising temperature; and the vaporised reactant is fed into the reaction chamber. According to the invention, the reactant source and the reaction chamber are located in separate vessels which can be individually evacuated. Preferably the reactant source and the reaction chamber are thermally isolated from each other. This can be achieved by providing them with active thermal isolation comprising separate cooling and heating means which keep the outer surfaces of the vessels at ambient temperature and achieves the necessary heating inside the vessel.

The heating means can comprise tubular resistive heater elements.

The gas spaces of the reactant source and the reaction chamber are adapted to be communicating in order to allow for feed of gas phase reactant from the reactant source to the reaction chamber. However, the interconnecting first conduit preferably comprises also at least one valve which is used for separating the gas spaces of the reactant source and the reaction chamber during evacuation and/or maintenance of either or both of the vessels. It is also possible to arrange for inert gas valving in the conduit to prevent flow of reactant from the reactant source to the reaction chamber by forming a gas phase barrier of a gas flowing in the opposite direction to the reactant flow in the conduit.

Because inactive, preferably inert gas, is fed into the reactant source, the reactant source can be operated at a pressure in excess of the pressure of the reaction chamber. For that purpose, the reactant source comprises at least one inlet for feeding gas into the reactant source and at least one outlet for with-drawing gas from the reactant source. The outlet of the reactant source preferably communicates with the reaction chamber.

In order to remove any dispersed liquid droplets or solid particles, the vaporised reactant is conducted to a purifier. The purifier can comprise a semipermeable membrane or similar filter capable of essentially completely removing fines having a size of less than 0.01 $\mu$m, preferably less than 0.005 $\mu$m.

As discussed in more detail in connection with the attached drawings, according to a preferred embodiment, the method of the invention comprises the following step:

vaporising the reactant from liquid or solid reactant matter maintained in a reactant source comprising a first container having an opening, said first container being placed within a pressure shell and being heated to the vaporising temperature by using heating means fitted within the pressure shell;

conducting the vaporised reactant from the container through a first purifier to remove impurities contained in the vaporised reactant;

collecting the vaporised reactant in a gas space: and feeding gas phase reactant from the gas space into the gas phase reaction chamber via the first conduit.

In this embodiment, in order to free the vaporised reactant from liquid or solid impurities, the evaporated reactant can be purified in a first purifier and then collected in the gas space mentioned. The first purifier comprises, e.g. a filter (of any of the kind disclosed in connection with the second filter below) covering the opening of the container.

The present method can be employed in any gas phase process including chemical vapour deposition, CVD. In particular it is suited to use in Atomic Layer Deposition, ALD, (formerly known as Atomic Layer Epitaxy, abbreviated ALE). Commercially available technology is supplied by ASM Microchemistry Oy, Espoo, Finland, under the trade mark ALCYD. In the ALD technology, reactants are fed in the form of gas phase pulses alternately and separately into the reaction chamber. For the ALD embodiment, the present method can be modified by collecting the vaporised reactant in a gas space having a gas volume significantly greater than the volume of the gas phase pulse; and feeding one gas phase pulse at a time from the gas space into the gas phase reaction chamber via the first conduit.

The gas space in which the vaporised reactant is collected can be formed around the reactant container, e.g. by the space between the container and a second container surrounding it.

The gas space is maintained at a temperature equal to or higher than the vaporising temperature to avoid condensation of the reactant. The gas volume of the gas space is preferably at least 5 times greater than the gas volume of one gas phase pulse.

The container wall of the second container is made of a metal selected from the group of stainless steel, titanium and aluminium, whereas the first container, in the following also called "ampoule", is made from glass.

The first container can also be made of a material which has an additional non-reactive surface coating to prevent corrosion of the material.

A substantial length of the first conduit interconnecting the reactant source with the reaction chamber is contained within the pressure shell. Thus, the need for providing heating means around the conduit to prevent condensation of reactant vapours is reduced or eliminated.

A second purifier can be placed in the first conduit. The second purifier comprises a purifying means selected from the group of mechanical filters, ceramic molecular sieves and electrostatic filters capable of separating dispersed liquid or solid droplets or particles or molecules of a minimum molecular size from the reactant gas flow.

In order to prevent gas flow from the reactant source between the pulses, it is possible to form an inactive gas barrier, as mentioned above. In practice, the gas barrier can be formed by feeding inactive gas into said first conduit via a second conduit, connected to the first conduit at a connection point, during the time interval between the feed of vapour-phase pulses from the gas space. The inactive gas is withdrawn from said first conduit via a third conduit connected to the first conduit, said third conduit being maintained at a temperature equal to or higher than the condensation temperature of the vapour-phase reactant and being connected to the first conduit at a point upstream of the second conduit. Thereby, an inactive gas flow of opposite direction to the reactant gas flow is achieved.

A substantial length of the second conduit is preferably placed within the pressure shell to avoid the need for external heating.

The third conduit is maintained at a temperature equal to or lower than the reaction temperature. The third conduit comprises an open gas flow channel placed within the pressure shell.

In all of the above embodiments inactive gas, such as nitrogen or argon, is used as a carrier gas for the vaporised solid or liquid reactant. The inactive gas is fed into the gas space via a fourth conduit.

It is particularly preferred to control the flow of vaporised reagent and optionally inactive gas through the first conduit by valves whose regulating means are placed on the outside of the pressure shell.

In practice the reactant source assembly can be formed into a separate modular unit which can be replaced by a similar unit when a new loading of the reactant chemical is needed. For this purpose the above mentioned second container is preferably detachably connected to the first and the fourth conduits.

Thus, in summary, the novel apparatus for feeding a gas phase reactant from a reactant source into a gas phase reaction chamber comprises a reactant source which can be maintained at a vaporising temperature for vaporising a liquid or solid reactant, and a reaction chamber, the reactant source and the reaction chamber comprising separate vessels which can be individually evacuated. The reactant source and the reaction chamber are preferably thermally isolated from each other and interconnected with a first conduit comprising at least one valve. In the first conduit the flow of reactant from the reactant source to the reaction chamber can be prevented by forming a gas phase barrier of a gas flowing in the opposite direction to the reactant flow in the conduit and the valve can be used for separating the gas spaces of the reactant source and the reaction chamber during evacuation of either or both of the vessels. The reactant source comprises at least one inlet for feeding gas into the reactant source and at least one outlet for withdrawing gas from the reactant source. The outlet of the reactant source communicates with the reaction chamber.

Based on the above, the reactant source assembly according to the invention comprises a first container having an opening and containing liquid or solid reactant matter and a second container having a gas tight container wall enclosing the first container and defining a gas space around the first container.

There is at least one first gas nozzle fitted in the container wall of the second container for feeding gas into the gas space; at least one second gas nozzle fitted in the container wall of the second container for withdrawing reactant vaporized from first container and collected in the gas space. At least one valve is connected to the first gas nozzle for controlling gas flow through the first gas nozzle into the gas space and at least one valve is fitted to the second gas nozzle for controlling gas flow through the second gas nozzle from the gas space.

Turning now to the embodiment shown in the attached drawings, it can be noted that the following reference numerals are used:

1. Vacuum vessel
1'. Valve
2. Heating elements
2'. Heat reflector box
3. Heat reflector sheet
3'. Heat reflector door -continued 4. Solid source
4'. Water cooling
5. Inert gas valving
6. Filter
7. Gas space
8. Closing valves
9. Actuator
9'. Line pipe
10. Lead-in
11. Ampoule
12. Lid
13. Sinter
14. Lead-in
15. Pressure relief valve
16. Closing valve
17. Closing valve
30. Space for liquid or solid source chemical
31. Sinter
40. Space for liquid or solid source chemical
41. Sinter
50. Space for liquid or solid source chemical
51. Sinter
60. Reaction chamber The reactant source is fitted into a vacuum vessel 1 the inner parts of which are heated by using radiation heaters 2 and a beat reflector sheet 3. The pressure shell of the vessel is equipped with water cooling 4, 4' for cooling the surface of the vessel to ambient temperature. The vacuum vessel is provided with a reactant source container which is capable of containing a sufficient amount of chemical for allowing for operation during an extended period of time, e.g. three months. The operational temperature of the reactant source module is 20 to 400° C.

The reactant container comprises a glass ampoule 11 which prevents direct contact between the chemical contained therein and the steel container surrounding the ampoule. The ampoule comprises a casing and a cover (a lid 12) which are joined together by conical joint having polished surfaces. The lid exhibits a ceramic sinter whose main task is to prevent carrier gas flow fed into the vessel from hitting the powdery reactant. Between the reactant source container and the glass ampoule there is formed a gas space 7 which has an essentially larger volume than one individual gas phase pulse. Thus, the gas space will be capable of diluting the concentration of the reactant pulse and to maintain a constant concentration of the gas phase pulse.

The pulsing of the vaporised reactant from the source is implemented using a nitrogen gas barrier 5. In this case there is only one pulsating valve and it has been fitted outside the vacuum vessel.

It is possible to attach several solid source assemblies to the reactor pressure shell, which makes it possible to operate at different temperatures.

Inside the vacuum vessel there is a commercial filtration unit 6 which has an inner portion comprising a membrane made of ceramics, steel or inert metal. The filter can be cleansed during operation by heating it to a temperature in excess of the use temperature and by pumping away the vaporised substance. The filter removes 99.9999999% of particles larger than 0.003 μm.

The reactant source ampoule can be exchanged during operation without contacting the chemical with air at any stage. This is carried out with the aid of fill-metallic closing valves 8 and nitrogen pressure in the piping. The reactant source can be changed without breaking of the vacuum in the reactor. This can be effected by closing the gas conduits communicating with the reactor with closing valves and by forming an inert gas valving against the flow of reactant gas from the source towards the reactor. No air is admitted into the reaction chamber.

The closing valves are used for closing the reactant source and for closing the gas conduit interconnecting the reactant source and the reaction chamber after each processing. The valves can also be used during heating and cooling of the reactant source. The highest operational temperature of the housing of the valve is, e.g. close to 500° C. The valve assembly is constructed in such a way that the pneumatic actuator 9 is placed outside the vacuum vessel. The closing movement required by the valve can be achieved via a linear lead-in 10. Since the valve is made throughout of metal it is not entirely leak-tight. For this reason there is arranged on the opposite side of the valve a nitrogen pressure, which hinders leading, e.g. into the piping.

In the embodiment disclosed in the drawings, the piping of the assembly and the reactant source vessel are placed within the pressure shell of the vacuum vessel. Preferably, there is a constant flow of nitrogen in the piping and/or constant control of the pressure. The construction hinders health hazards caused by any leaks and processing problems caused by air leaking into the equipment.

Figures 5A, 5B, 5C:
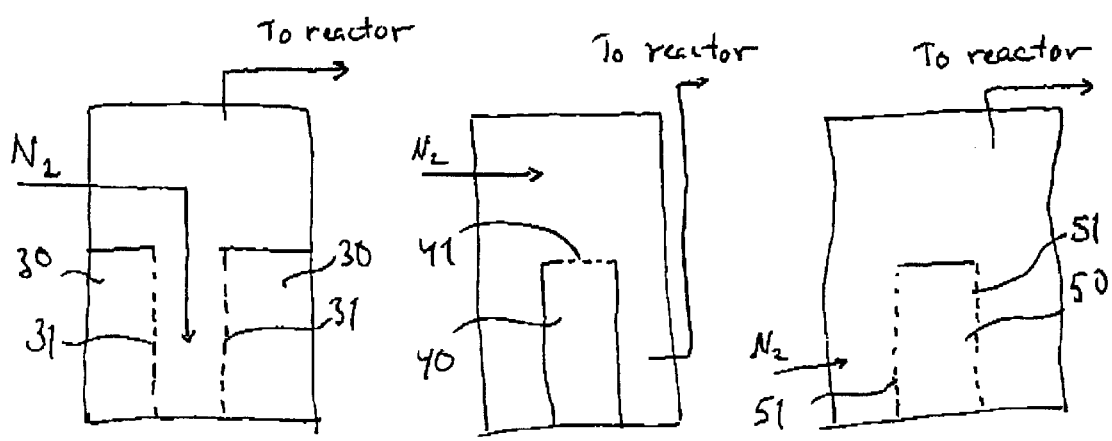
FIGS. 5a to 5c show various embodiments of the reactant container.

FIGS. 5a–5c show three embodiments of the reactant container. In the first embodiment the container 30 has a central axis and an annular cross-section perpendicular to the central axis. The opening 31 is formed at least on the inner surface of the container. The opening is covered with a membrane, preferably a semipermeable membrane (including a ceramic membrane of the sinter-type) providing for dust removal. There are inlet and outlet nozzles of the carrier gas flow and the carrier gas+reactant gas flow.

In the second embodiment, the container 40 is cylindrical and it has and opening 41 at the top end. This embodiment was also discussed above in connection with the working embodiment. In the third embodiment, the container 50 is cylindrical and it has an opening 51 on the side walls, i.e. the side walls are made of a porous material, preferably a ceramic sinter to provide for filtering operation.

What is claimed is:

1. A method of feeding a gas phase reactant from a reactant source into a gas phase reaction chamber comprising a reactant which is a liquid or solid at ambient temperature is vaporized from the reactant source at a vaporizing temperature, wherein the vaporized reactant is fed into the reaction chamber through a first conduit, and the reactant source and the reaction chamber are located in separate vessels which can be individually evacuated, the method comprising:

vaporizing the reactant from liquid or solid reactant matter maintained in a reactant source comprising a first container having an opening, said first container being placed within a pressure shell and being heated to the vaporizing temperature by using heating means fitted within the pressure shell;

conducting the vaporized reactant from the container through a first purifier to remove impurities contained in the vaporized reactant;

collecting the vaporized reactant in a gas space; and feeding gas phase reactant from the gas space into the gas phase reaction chamber via the first conduit in the form of repeated alternating vapor-phase pulses.

2. The method according to claim 1, wherein the reactant source and the reaction chamber are thermally isolated from each other.

3. The method according to claim 1, wherein the first conduit comprises at least one valve.

4. The method according to claim 3, wherein the valve is used for separating the gas spaces of the reactant source and the reaction chamber during evacuation of either or both of the vessels.

5. The method according to claim 1, wherein the reactant source and the reaction chamber are interconnected with a first conduit in which the flow of reactant from the reactant source to the reaction chamber is prevented by forming a gas phase barrier of a gas flowing in the opposite direction to the reactant flow in the conduit.

6. The method according to claim 1, wherein the reactant source is operated at a pressure in excess of the pressure of the reaction chamber.

7. The method according to claim 1, wherein the reactant source comprises at least one inlet for feeding gas into the reactant source and at least one outlet for withdrawing gas from the reactant source.

8. The method according to claim 7, wherein the outlet of the reactant source communicates with the reaction chamber.

9. The method according to claim 1, wherein the purifier capable of removing fines having a size of less than 0.01 $\mu$m.

10. The method according to claim 1, wherein the reactant is fed into the reaction chamber in the form of gas phase pulses, comprising collecting the vaporized reactant in the gas space having a gas volume significantly greater than the volume of the gas phase pulse; and feeding one gas phase pulse at a time from the gas space into the gas phase reaction chamber via a first conduit.

11. The method according to claim 1, wherein the container is provided with active thermal insulation.

12. The method according to claim 1, wherein the vaporized reactant is purified in the first purifier and then collected in the gas space.

13. The method according to claim 1, wherein the first purifier comprises a mechanical filter covering the opening of the container.

14. The method according to claim 1, wherein the container has a central axis and an annular cross-section perpendicular to the central axis, the opening being formed at least on the inner surface of the container.

15. The method according to claim 1, wherein the container has a central axis and a circular cross-section perpendicular to the central axis, the opening being formed on the top surface of the container.

16. The method according to claim 1, wherein the container has a central axis and a circular cross-section perpendicular to the central axis, the opening being formed on the side walls of the container.

17. The method according to claim 1, wherein the gas space surrounds the container.

18. The method according to claim 17, wherein the gas space is formed in the interspace between the first container and a second container surrounding the first container.

19. The method according to claim 18, wherein the inactive gas is fed into the gas space via a fourth conduit and wherein the second container is detachably connected to the first and the fourth conduits.

20. The method according to claim 1, wherein the gas space is maintained at a temperature equal to or higher than the vaporizing temperature.

21. The method according to claim 1, wherein the gas volume of the gas space is at least 5 times greater than the gas volume of one vapor phase pulse.

22. The method according to claim 1, wherein a substantial length of the first conduit is contained within the pressure shell.

23. The method according to claim 1, wherein a second purifier is placed in the first conduit.

24. The method according to claim 23, wherein the second purifier comprises a purifying means selected from the group consisting of mechanical filters, ceramic molecular sieves and electrostatic filters.

25. The method according to claim 1, wherein inactive gas is fed into said first conduit via a second conduit, connected to the first conduit at a connection point, during the time interval between the feed of the alternating vapor-phase pulses from the gas space so as to form a gas phase barrier against the flow of vaporized reactants from the reactant source via the first conduit into the reaction chamber; and the inactive gas is withdrawn from said first conduit via a third conduit connected to the first conduit, said third conduit being maintained at a temperature equal to or higher than the condensation of the vapor-phase reactant and being connected to the first conduit at a point between the second conduit and the reactant source.

26. The method according to claim 25, wherein a substantial length of the second conduit is placed within the pressure shell.

27. The method according to claim 25, wherein, at least for some length of the first conduit the inactive gas fed via the second conduit is conducted in opposite direction to the reactant flow.

28. The method according to claim 25, wherein the third conduit is maintained at a temperature equal to or lower than a reaction temperature of the reaction chamber.

29. The method according to claim 25, wherein the third conduit comprises an open gas flow channel placed within the pressure shell.

30. The method according to claim 1, wherein inactive gas is used as a carrier gas for the vaporised solid or reactant.

31. The method according to claim 30, wherein the inactive gas is fed into as space via a fourth conduit.

32. The method according to claim 1, wherein the flow of vaporized reagent and optionally inactive gas through the first conduit is controlled by valves whose regulating means are placed on the outside of the pressure shell.

33. The method according to claim 1, wherein the heating means comprise tubular resistive heater elements.

34. The method according to claim 1, wherein the heating means are fitted close to the pressure shell.

* * * * *